US009478939B2

(12) United States Patent
Lai et al.

(10) Patent No.: US 9,478,939 B2
(45) Date of Patent: *Oct. 25, 2016

(54) LIGHT COUPLING DEVICE AND METHODS OF FORMING SAME

(71) Applicant: Taiwan Semiconductor Manufacturing Company, Ltd., Hsin-Chu (TW)

(72) Inventors: Jui Hsieh Lai, Taoyuan (TW); Ying-Hao Kuo, Hsin-Chu (TW); Hai-Ching Chen, Hsin-Chu (TW); Tien-I Bao, Dayuan Township (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 14/632,146

(22) Filed: Feb. 26, 2015

(65) Prior Publication Data

US 2015/0168659 A1 Jun. 18, 2015

Related U.S. Application Data

(63) Continuation of application No. 13/797,999, filed on Mar. 12, 2013, now Pat. No. 8,976,833.

(51) Int. Cl.
*H01S 5/00* (2006.01)
*H01S 5/026* (2006.01)
*H01S 5/022* (2006.01)
(Continued)

(52) U.S. Cl.
CPC ............ *H01S 5/0267* (2013.01); *G02B 6/421* (2013.01); *H01S 5/026* (2013.01); *H01S 5/02276* (2013.01); *H01S 5/02284* (2013.01); *H01S 5/02288* (2013.01); *H01S 5/183* (2013.01); *H01L 2224/32225* (2013.01); *H01L 2224/48091* (2013.01); *H01L 2224/48227* (2013.01); *H01L 2224/48464* (2013.01);
(Continued)

(58) Field of Classification Search
CPC ...... H01S 5/0267; H01S 5/026; H01S 5/183; H01S 5/0288
USPC ..................... 372/50.23, 50.124, 50.1, 43.01
See application file for complete search history.

(56) References Cited

U.S. PATENT DOCUMENTS 6,670,599 B2 12/2003 Wagner et al.
7,335,986 B1 2/2008 Paek et al.
(Continued)

FOREIGN PATENT DOCUMENTS

CN 1818733 A 8/2006
CN 101389988 A 3/2009

OTHER PUBLICATIONS

Noriki, A., et al., "Through Silicon Photonic Via (TSPV) with Si Core for Low Loss and High-Speed Data Transmission in Opto-Electronic 3-D LSI," 2010 IEEE International 3D Systems Integration Conference (3DIC), Nov. 16-18, 2010, pp. 1-4.

*Primary Examiner* — Kinam Park
(74) *Attorney, Agent, or Firm* — Slater Matsil, LLP

(57) ABSTRACT

An embodiment is a semiconductor device comprising an optical device over a first substrate, a vertical waveguide on a top surface of the optical device, the vertical waveguide having a first refractive index, and a capping layer over the vertical waveguide, the capping layer configured to be a lens for the vertical waveguide and the capping layer having a second refractive index.

20 Claims, 8 Drawing Sheets

(51) Int. Cl.
  *H01S 5/183* (2006.01)
  *G02B 6/42* (2006.01)
(52) U.S. Cl.
  CPC ............ *H01L 2224/73265* (2013.01); *H01L 2224/8592* (2013.01); *H01L 2924/15311* (2013.01)

(56) References Cited

U.S. PATENT DOCUMENTS

| | | | |
|---|---|---|---|
| 7,942,558 B2 | 5/2011 | Zweig et al. | |
| 8,565,279 B2 | 10/2013 | Okumura et al. | |
| 8,976,833 B2* | 3/2015 | Lai | H01S 5/0267 372/43.01 |
| 9,041,015 B2* | 5/2015 | Lai | H01S 5/0262 257/81 |
| 2004/0069984 A1 | 4/2004 | Estes et al. | |
| 2004/0120672 A1 | 6/2004 | Chong et al. | |
| 2004/0126064 A1 | 7/2004 | Vandentop et al. | |
| 2004/0178488 A1 | 9/2004 | Bolken et al. | |
| 2005/0196094 A1 | 9/2005 | Glebov et al. | |
| 2006/0174652 A1 | 8/2006 | Khanarian et al. | |
| 2006/0261432 A1 | 11/2006 | Yoshimura et al. | |
| 2007/0147459 A1 | 6/2007 | Ueki | |
| 2008/0247703 A1 | 10/2008 | Kodama et al. | |
| 2009/0243079 A1 | 10/2009 | Lim et al. | |
| 2010/0116976 A1 | 5/2010 | Wober | |
| 2010/0320600 A1 | 12/2010 | Pratt | |
| 2012/0020612 A1 | 1/2012 | Ito et al. | |
| 2014/0269804 A1 | 9/2014 | Lai et al. | |

* cited by examiner

LIGHT COUPLING DEVICE AND METHODS OF FORMING SAME

This application is a continuation of U.S. application Ser. No. 13/797,999, titled "Light Coupling Device and Methods of Forming Same," filed on Mar. 12, 2013, which application is incorporated herein by reference.

BACKGROUND

The demand for continuous increase in transmission speed, data capacity and data density in integrated optical and optoelectronic circuits has been the motivating force behind numerous innovations in areas of broadband communications, high-capacity information storage, and large screen and portable information display. Although glass optical fibers are routinely used for high-speed data transfer over long distances, they are inconvenient for complex high-density circuitry because of their high density, poor durability, and high cost of fabrication for complex photonic circuits. As such, polymeric materials hold great promise for constructing cost effective, reliable, passive and active integrated components capable of performing the required functions for integrated optical and optoelectronic devices.

BRIEF DESCRIPTION OF THE DRAWINGS

For a more complete understanding of the present embodiments, and the advantages thereof, reference is now made to the following descriptions taken in conjunction with the accompanying drawings, in which.

DETAILED DESCRIPTION OF ILLUSTRATIVE EMBODIMENTS

Figure 1A:
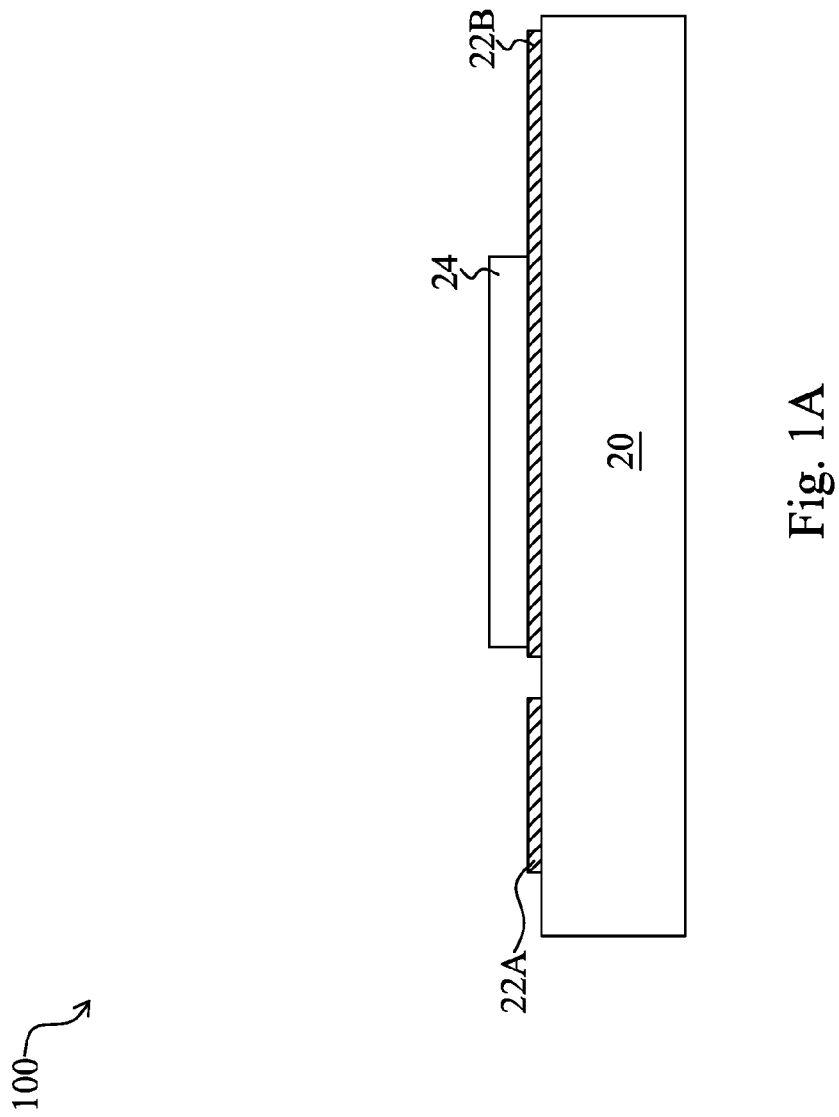
FIGS. 1A through 1E illustrate intermediate stages of forming a semiconductor device according to an embodiment.

Reference will now be made in detail to embodiments illustrated in the accompanying drawings. Wherever possible, the same reference numbers are used in the drawings and the description to refer to the same or like parts. In the drawings, the shape and thickness may be exaggerated for clarity and convenience. This description will be directed in particular to elements forming part of, or cooperating more directly with, methods and apparatus in accordance with the present disclosure. It is to be understood that elements not specifically shown or described may take various forms well known to those skilled in the art. Many alternatives and modifications will be apparent to those skilled in the art, once informed by the present disclosure.

Reference throughout this specification to "one embodiment" or "an embodiment" means that a particular feature, structure, or characteristic described in connection with the embodiment is included in at least one embodiment. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments. It should be appreciated that the following figures are not drawn to scale; rather, these figures are merely intended for illustration.

Embodiments will be described with respect to a specific context, namely a light coupling device with a vertical waveguide formed directly on a vertical-cavity surface-emitting laser (VCSEL). Other embodiments may also be applied, however, to forming waveguides directly on other components such as laser diodes, photo detectors, integrated optical circuits, or other optical components.

With reference now to FIG. 1, there is shown a semiconductor device 100 at an intermediate stage of processing according to an embodiment. The semiconductor device 100 includes a substrate 20, a redistribution layer (RDL) 22 over the substrate 20 including a first RDL 22A and a second RDL 22B, and a bonding structure 24 on the second RDL 22B. The substrate 20 may be any suitable substrate, such as a 1/2/1 laminate substrate, a 4-layer laminate substrate, an interposer, a packaging substrate, a die/wafer, a printed-circuit board, a high-density interconnect, or the like. The substrate 20 may be silicon, silicon germanium, silicon carbide, a ceramic substrate, a quartz substrate, the like, or a combination thereof. The substrate 20 may comprise bulk silicon, doped or undoped, or an active layer of a silicon-on-insulator (SOI) substrate.

The substrate 20 may include integrated circuit devices (not shown). As one of ordinary skill in the art will recognize, a wide variety of integrated circuit devices such as transistors, capacitors, resistors, combinations of these, or the like may be used to generate the structural and functional requirements of the design for the semiconductor device 100. The integrated circuit devices may be formed using any suitable methods.

The substrate 20 may also include an interconnect structure (not shown). The interconnect structure may be formed over the integrated circuit devices and be designed to connect the various integrated circuit devices to form functional circuitry. The interconnect structure may be formed of alternating layers of dielectric (e.g., low-k dielectric material) and conductive material (e.g., copper) and may be formed through any suitable process (such as deposition, damascene, dual damascene, or the like). The conductive and dielectric layers may include metal lines and vias (not shown) to electrically couple the integrated circuit devices to the RDL 22. Only a portion of the substrate 20 is illustrated in the figures, as this is sufficient to fully describe the illustrative embodiments.

The RDLs 22A and 22B may be formed to extend along the substrate 20. The RDLs 22A and 22B may be utilized as a redistribution layer to allow the subsequently formed devices and structures (see FIG. 1B) that are electrically connected to the interconnect structure (not shown) and/or active and passive devices to be placed in any desired location on the substrate 20, instead of limiting the location of the subsequently formed devices and structures to locations that are directly over the interconnect structure and/or active and passive devices. In an embodiment the RDLs 22A and 22B may be formed by initially forming a seed layer (not shown) of a titanium copper alloy through a suitable formation process such as chemical vapor deposition (CVD) or sputtering. A photoresist (not shown) may then be formed to cover the seed layer, and the photoresist may then be patterned to expose those portions of the seed layer that are located where the RDLs 22A and 22B are desired to be located.

Once the photoresist has been formed and patterned, a conductive material, such as copper, may be formed on the seed layer through a deposition process such as plating. The conductive material may be formed to have a thickness of between about 1 μm and about 10 μm, such as about 5 μm, and a width along the substrate 20 of between about 5 μm and about 300 μm, such as about 15 μm. However, while the material and methods discussed are suitable to form the conductive material, these materials are merely exemplary. Any other suitable materials, such as AlCu or Au, and any other suitable processes of formation, such as CVD or physical vapor deposition (PVD), may alternatively be used to form the RDLs 22A and 22B.

Once the conductive material has been formed, the photoresist may be removed through a suitable removal process such as ashing. Additionally, after the removal of the photoresist, those portions of the seed layer that were covered by the photoresist may be removed through, for example, a suitable etch process using the conductive material as a mask. Alternatively, the seed layer could be patterned before the plating process.

After the RDLs 22A and 22B have been formed, the bonding structure 24 may be formed on the RDL 22B. The bonding structure 24 may be utilized to allow the subsequently formed optical device 26 (see FIG. 1B) to be electrically coupled to the RDL 22B. In some embodiments, the bonding structure 24 may be a solder paste, a conductive adhesive, or the like. In other embodiments, the bonding structure 24 may be one or more bond pads, under bump metallizations (UBM), landing pads, metal pillars, metal bumps, the like, or a combination thereof. The bonding structure 24 may comprise copper, aluminum, gold, titanium, nickel, tungsten, the like, or a combination thereof.

Figure 1B:
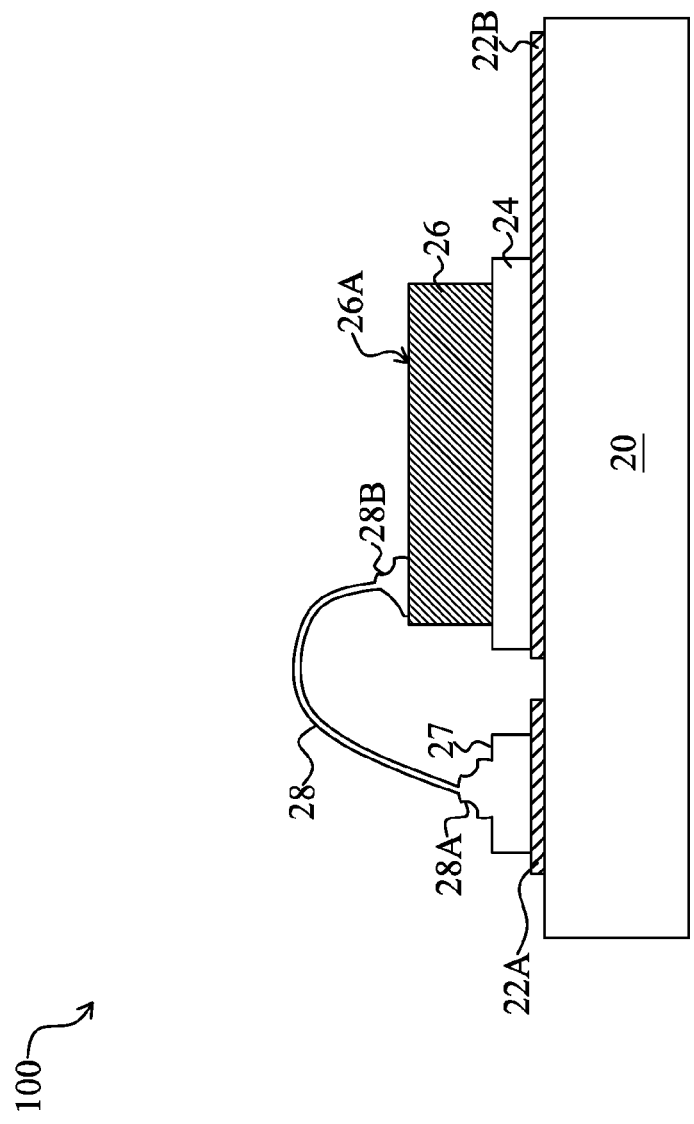

FIG. 1B illustrates bonding an optical device 26 to the bonding structure 24 and forming a wire bond 28 interconnecting the optical device 26 and the RDL 22A. The optical device 26 may be coupled to the bonding structure 24 and the wire bond 28 in order to convert an electrical signal to an electromagnetic signal such as light and/or convert an electromagnetic signal such as light into an electrical signal. The optical device 26 may include one or more laser diodes, photo diodes, integrated optical circuits, or other optical components. In some embodiments, the optical device 26 is a vertical-cavity surface-emitting laser (VCSEL) including a photo diode.

The bonding between the optical device 26 and the bonding structure 24 may be a solder bonding or a direct metal-to-metal (such as a copper-to-copper or tin-to-tin) bonding. In an embodiment, the optical device 26 may include one or more bond pads, conductive bumps, and/or pillars and the bonding structure 24 may include a solder paste or conductive material. In another embodiment, the bonding structure 24 may include one or more UBMs with metal bumps on them and the optical device 26 may have one or more contact pads to couple to the metal bumps. In other embodiments the optical device 26 may be mounted to the bonding structure via a ball grid array, via sockets, via surface mounting technology, or the like.

The wire bond 28 includes a first end 28A and a second end 28B, wherein the first end 28A is coupled to the RDL 22A via a contact pad 27 and the second end 28B is coupled to a top surface 26A of the optical device 26. The wire bond 28 may be utilized to electrically connect the optical device 26 to the active and/or passive devices in the substrate 20 and/or other external devices. The contact pad 27 may comprise copper, gold, aluminum, nickel, the like, or a combination thereof.

The wire bond 28 may be formed using a wire bonder that includes a capillary for dispensing a metal wire, an electric flame off (EFO) wand, and a transducer, not shown. The wire is inserted into the capillary, which is adapted to control and move the wire during the bonding process. A ball may be formed on the ends of the wire before bonding the wire to the RDL 22A and/or the optical device 26. The ball may then be attached to the contact pad 27 or the top surface 26A of the optical device 26 by pressing with force, vibration (e.g. supersonic), and/or heat the respective end (28A or 28B) of the wire 28 to contact pad 27 or the top surface 26A. The wire may comprise copper, aluminum, gold, palladium, platinum, the like, or a combination thereof. Alternatively, the wire may comprise other conductive materials and/or metals. In an embodiment, the wire has a diameter in a range from about 1 to 2 mm. In other embodiments, the optical device 26 may be coupled to the RDL 22 using other methods.

Figure 1C:
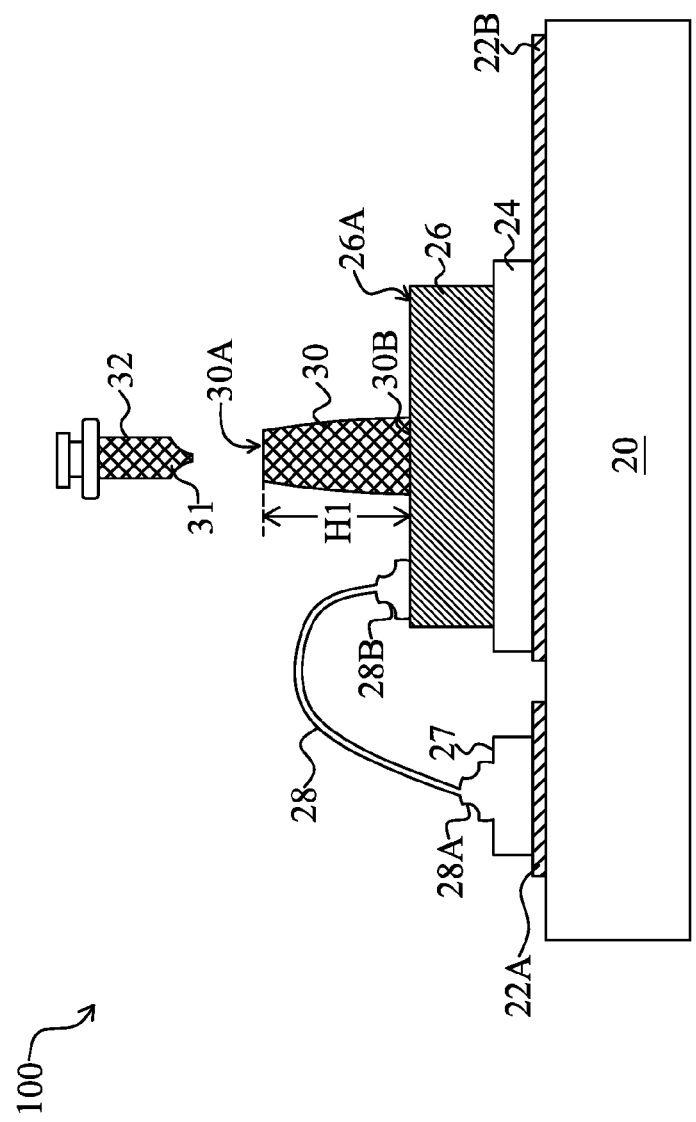

FIG. 1C illustrates the formation of a vertical waveguide 30 on the optical device 26. The vertical waveguide 30 may accept light from a top surface 30A and a bottom surface 30B and channel the light to its desired destination (e.g., the optical device 26 or an external device over the vertical waveguide 30). The vertical waveguide 30 may be any type of waveguide, such as a planar waveguide, a channel waveguide, or the like, and may comprise two different materials, a core material and a cladding material, in which the core material has a refractive index higher than the cladding material. An optional refractive index matching material (not shown) may be formed between the bottom 30B of the vertical waveguide 30 and the top surface 26A of the optical device 26. The vertical waveguide 30 has a longitudinal axis extending from the bottom surface 30B to the top surface 30A, wherein the longitudinal axis is substantially orthogonal to a top surface of the substrate 20. In an embodiment, the longitudinal axis of the vertical waveguide 30 is substantially orthogonal to the top surface 26A of the optical device 26.

As illustrated in FIG. 1C, a dispenser 32 dispenses the waveguide material 31 on to the top surface 26A of the optical device 26 to form the vertical waveguide 30. The waveguide material 31 may be dispensed in a liquid form that has a high viscosity. In some embodiments, waveguide material 31 may be dispensed with a viscosity larger than 30,000 centipoise (cP) per 25 revolutions per minute (rpm) at 25° C. The waveguide material 31 may be dispensed at a temperature from about room temperature (~25° C.) to about 70° C. In an embodiment, the vertical waveguide 30 may be formed to have a height H1 in a range from 50 um to about 500 um. After the dispensing, the waveguide material 31 is fully cured to form the vertical waveguide 30. As illustrated, the vertical waveguide 30 tapers from the bottom surface 30B to the top surface 30A. However, in other embodiments, the vertical waveguide 30 may be columnar and have sidewalls that are substantially orthogonal to the top surface of the substrate 20.

In an embodiment the waveguide material 31, and thus, the vertical waveguide 30 may comprise a combination of polymer materials, such as poly(methylmethacrylate) (PMMA), polystyrene (PS), polycarbonate, polyurethane, benzocyclobutane, perfluorovinyl ether cyclopolymer, tetrafluoroethylene, perfluorovinyl ether copolymer, silicone, fluorinated poly(arylene) ether sulfide, poly(pentafluorostyrene), fluorinated dendrimers, fluorinated hyperbranched polymers, or the like. Alternatively, the vertical waveguide 30 may comprise deuterated and halogenrate polyacrylates, fluorinated polyimides, perfluorocyclobutyl aryl ether polymers, nonlinear optical polymers, or the like.

Figure 1D:
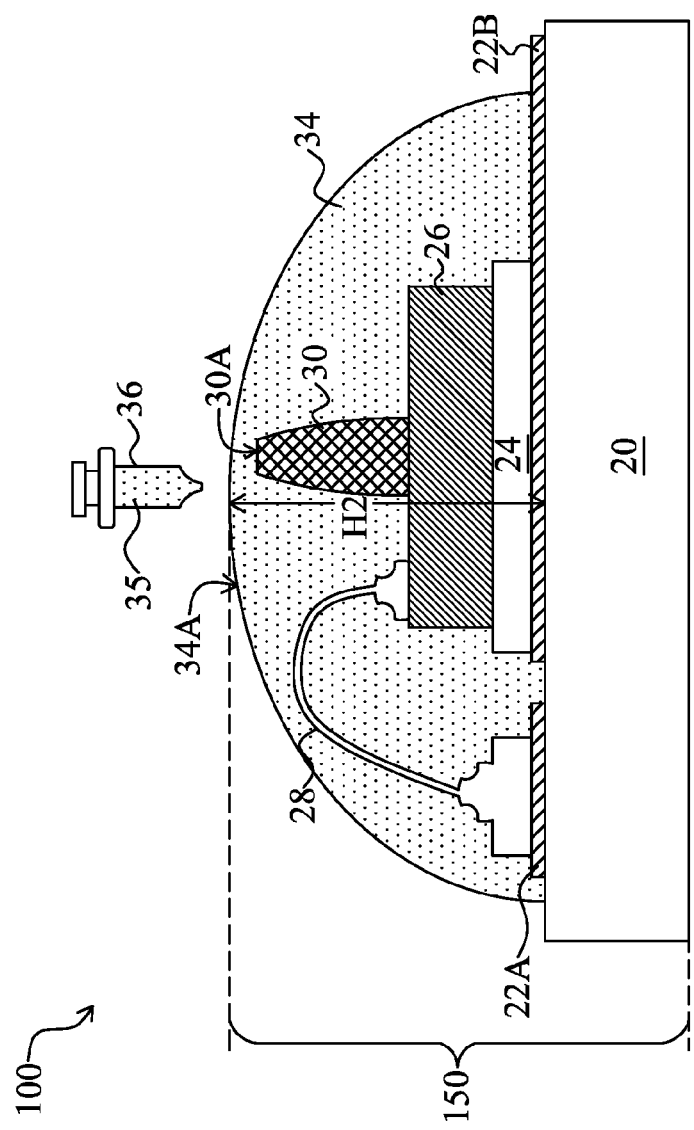
Figure 1E:
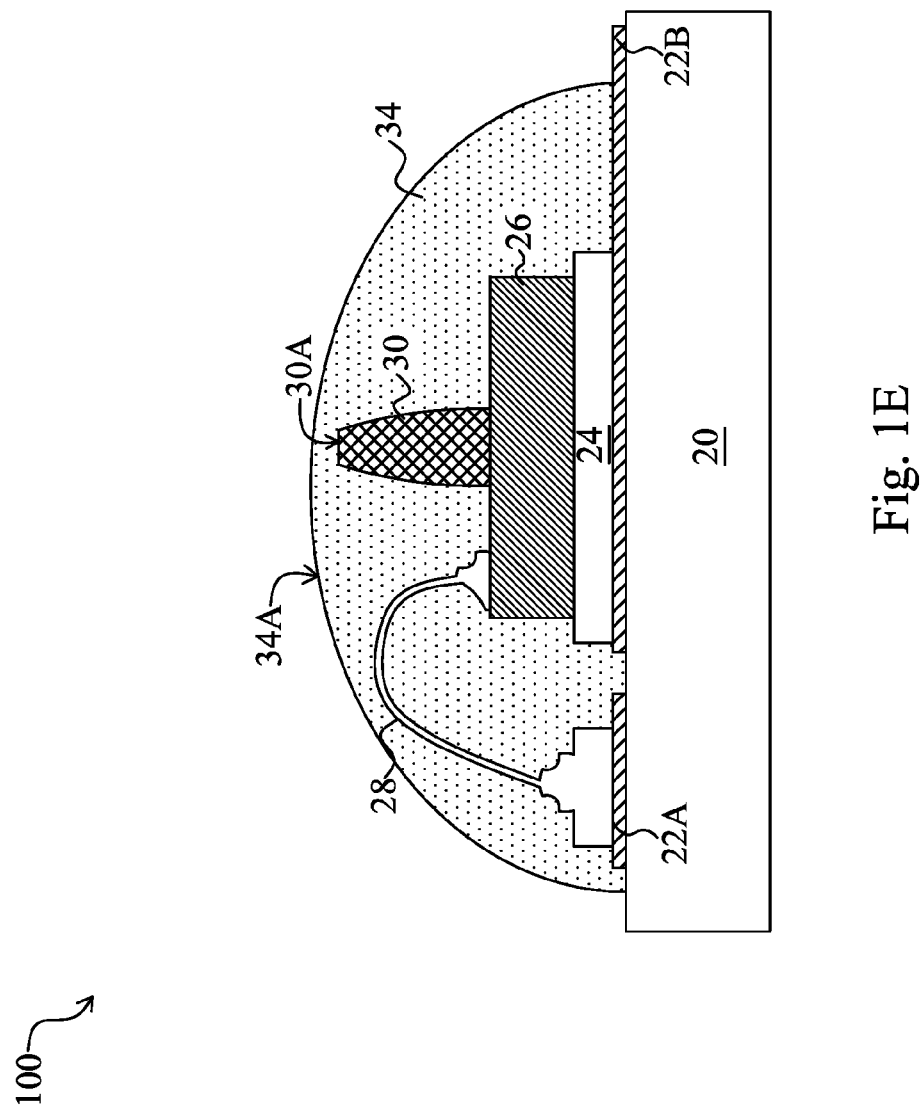

After the vertical waveguide 30 is formed, a capping layer 34 may be formed over the vertical waveguide 30, the wire bond 28, the optical device 26, and the substrate 20 as illustrated in FIG. 1D. In an embodiment, the capping layer 34 may act as a cladding layer and/or a ball lens (may be referred to as a lens layer 34) for the vertical waveguide 30 as well as an underfill to protect the wire bond 28 and the optical device 26. In an embodiment, the refractive index of the vertical waveguide 30 is in a range from about 1.4 to about 1.8, and the refractive index of the capping layer 34 is in the range from about 1.4 to about 1.8. In an exemplary embodiment, the refractive index of the waveguide 30 is larger than the refractive index of the capping layer 34. The capping layer 34 may be a polymer, an epoxy, a molding compound, the like, or a combination thereof. Also, the capping layer 34 may comprise similar materials as discussed above for the vertical waveguide 30, although the vertical waveguide 30 and the capping layer 34 need not be the same material. A top surface 34A of the capping layer 34 may be above, below, or substantially coplanar with the top surface 30A of the vertical waveguide 30. In some embodiments, the top surface 34A of the capping layer 34 may substantially form a dome over the top surface of the substrate 20. The apex of the dome may have a height H2 in a range from 500 um to about 3000 um. In some embodiments, the height H2 of the capping layer 34 may be greater than the height H1 of the vertical waveguide 30. In these embodiments, the material of the capping layer 34 may be transparent (e.g. allow the electromagnetic signal to pass through with substantially no attenuation) at the frequency of the electromagnetic signal. After the formation of the capping layer 34, a semiconductor device 150 is formed that may be further packaged and processed (see FIGS. 1E and 4). This semiconductor device 150 may also be referred to as a light coupling device.

Figure 2:
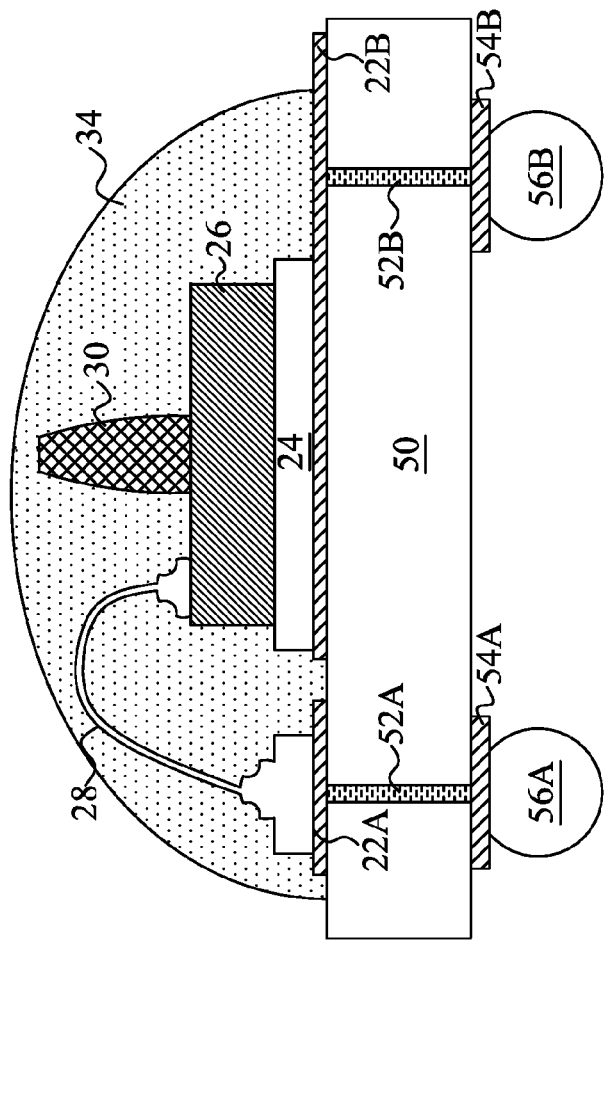
FIG. 2 illustrates a semiconductor device according to another embodiment.

FIG. 2 illustrates semiconductor device 200 according to another embodiment, wherein the semiconductor device 200 includes through substrate vias (TSVs) in a substrate and connectors formed on a backside of the substrate. Details regarding this embodiment that are similar to those for the previously described embodiment will not be repeated herein.

In an embodiment, the formation of semiconductor device 200 may begin with the formation of TSVs 52A and 52B extending through a substrate 50. The substrate 50 may be similar to substrate 20 described above and the description will not be repeated herein, although the substrates 50 and 20 need not be the same.

The TSVs 52A and 52B may be formed to provide a connection through the substrate 50 to an opposite side of the substrate 50. The TSVs 52A and 52B may be formed by applying and developing a suitable photoresist, and then etching the substrate 20, to generate TSV openings (filled later as discussed below). The openings for the TSVs 52A and 52B at this stage may be formed so as to extend into the substrate 20 to a predetermined depth. The depth may be between about 1 µm and about 700 µm below the surface on the substrate 50, such as a depth of about 50 µm. The openings for the TSVs 52A and 52B may be formed to have a diameter of between about 1 µm and about 100 µm, such as about 6 µm.

Once the openings for the TSVs 52A and 52B have been formed, the openings for the TSVs 52A and 52B may be filled with, e.g., a barrier layer and a conductive material. The barrier layer may comprise a conductive material such as titanium nitride, although other materials, such as tantalum nitride, titanium, a dielectric, or the like may alternatively be utilized. The barrier layer may be formed using a CVD process, such as plasma-enhanced CVD (PECVD). However, other alternative processes, such as sputtering or metal organic chemical vapor deposition (MOCVD), may alternatively be used. The barrier layer may be formed so as to contour to the underlying shape of the opening for the TSVs 52A and 52B.

The conductive material may comprise copper, although other suitable materials such as aluminum, alloys, doped polysilicon, combinations thereof, and the like, may alternatively be utilized. The conductive material may be formed by depositing a seed layer and then electroplating copper onto the seed layer, filling and overfilling the openings for the TSVs 52A and 52B. Once the openings for the TSVs 52A and 52B have been filled, excess barrier layer and excess conductive material outside of the openings for the TSVs 52A and 52B may be removed through a grinding process such as chemical mechanical polishing (CMP), although any suitable removal process may be used.

Once the conductive material is within the openings for the TSVs 52A and 52B, a thinning of the second side of the substrate 50 may be performed in order to expose the openings for the TSVs 52A and 52B and form the 52A and 52B from the conductive material that extends through the substrate 50. In an embodiment, the thinning of the second side of the substrate 50 may leave the TSVs 52A and 52B protruding from the second side of the substrate 50. The thinning of the second side of the substrate 50 may be performed by a planarization process such as CMP or etching.

However, as one of ordinary skill in the art will recognize, the above described process for forming the TSVs 52A and 52B is merely one method of forming the TSVs 52A and 52B, and other methods are also fully intended to be included within the scope of the embodiments. For example, forming the openings for the TSVs 52A and 52B, filling the openings for the TSVs 52A and 52B with a dielectric material, thinning the second side of the substrate 50 to expose the dielectric material, removing the dielectric material, and filling the openings for the TSVs 52A and 52B with a conductor may also be used. This and all other suitable methods for forming the TSVs 52A and 52B into the substrate 50 are fully intended to be included within the scope of the embodiments.

Alternatively, the TSVs 52A and 52B may be formed as each of the layers over the substrate 50 are individually formed. For example, the TSVs 52A and 52B may be formed partially concurrently with the RDLs 22A and 22B. For example, a portion of the openings for the TSVs 52A and 52B may be formed and filled within the substrate 50 prior to the formation of the RDLs 22A and 22B, and subsequent layers of the openings for the TSVs 52A and 52B may be formed and filled as each layer of the RDLs 22A and 22B are formed. Any of these processes, and any other suitable process by which the TSVs 52A and 52B may be formed, are fully intended to be included within the scope of the embodiments.

After the formation of the TSVs 52A and 52B, the bond pads 54A and 54B may be formed on the backside of the substrate 50. The bond pads 54A and 54B may electrically couple the bumps 56A and 56B to the TSVs 52A and 52B, respectively. In an embodiment, the bond pads 54A and 54B may each include a contact pad and a under bump metallization (UBM). In this embodiment, the contact pad may comprise aluminum, but other materials, such as copper, may alternatively be used. The contact pad may be formed using a deposition process, such as sputtering, to form a layer of material (not shown) and portions of the layer of material may then be removed through a suitable process (such as photolithographic masking and etching) to form the contact pad. However, any other suitable process may be utilized to form the contact pad. The contact pad may be formed to have a thickness of between about 0.5 μm and about 4 μm, such as about 1.45 μm.

Once the contact pad has been formed, the UBM may be formed in electrical contact with the contact pad. In an embodiment the UBM may comprise three layers of conductive materials, such as a layer of titanium, a layer of copper, and a layer of nickel. However, one of ordinary skill in the art will recognize that there are many suitable arrangements of materials and layers, such as an arrangement of chrome/chrome-copper alloy/copper/gold, an arrangement of titanium/titanium tungsten/copper, or an arrangement of copper/nickel/gold, that are suitable for the formation of the UBM. Any suitable materials or layers of material that may be used for the UBM are fully intended to be included within the scope of the current application.

The UBM may be created by forming each layer using a plating process, such as electrochemical plating, although other processes of formation, such as sputtering, evaporation, or PECVD process, may alternatively be used depending upon the desired materials. The UBM may be formed to have a thickness of between about 0.7 μm and about 10 μm, such as about 5 μm. Once the desired layers have been formed, portions of the layers may then be removed through a suitable photolithographic masking and etching process to remove the undesired material and to leave the UBM in a desired shape, such as a circular, octagonal, square, or rectangular shape, although any desired shape may alternatively be formed. Any suitable structures for bond pads 54A and 54B are fully intended to be included within the scope of the current application.

After the bond pads 54A and 54B have been formed, the bumps 56A and 56B may be formed. The bumps 56A and 56B may comprise a material such as tin, or other suitable materials, such as silver, lead-free tin, copper, or gold. In an embodiment in which the bumps 56A and 56B are tin solder bumps, the bumps 56A and 56B may be formed by initially forming a layer of tin through such commonly used methods such as evaporation, electroplating, printing, solder transfer, ball placement, or the like, to a thickness of, e.g., about 100 μm. Once a layer of tin has been formed on the structure, a reflow may be performed in order to shape the material into the desired bump shapes.

After the formation of the bumps 56A and 56B, the bumps 56A and 56B may be mounted to a carrier (not shown) during the remaining processing operations as described in the previous embodiment.

The number of TSVs 52, bond pads 54, bumps 56, and RDLs 22 are only for illustrative purposes and are not limiting. There could be any suitable number of TSVs 52, bond pads 54, bumps 56, and RDLs 22.

Figure 3:
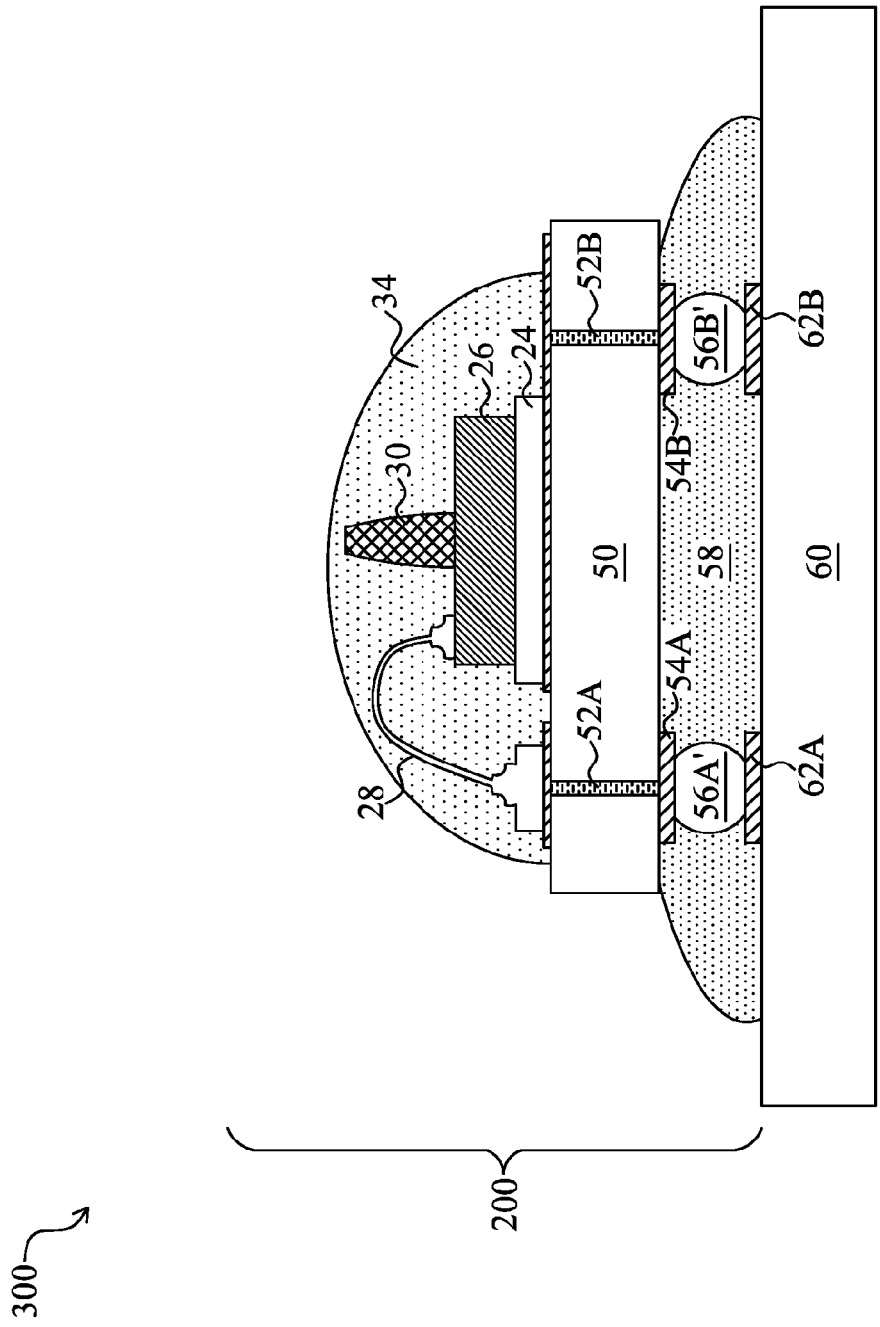
FIG. 3 illustrates the semiconductor device of FIG. 2 mounted to a substrate according to another embodiment.

FIG. 3 illustrates semiconductor device 300 according to another embodiment, wherein the semiconductor device 300 includes the semiconductor device 200 mounted to a substrate 60 via the bumps 56A' and 56B'. Details regarding this embodiment that are similar to those for the previously described embodiment will not be repeated herein.

After the formation of the semiconductor device 200 as described in the previous embodiment, the semiconductor device 200 may be mounted to a substrate 60. The substrate 60 may be similar to substrate 20 described above and the description will not be repeated herein, although the substrates 60 and 20 need not be the same. The substrate 60 may have bond pads 62A and 62B formed on a front side of the substrate 60 to electrically and physically couple the bumps 56A' and 56B'. The bond pads 62A and 62B may be similar to the bond pads 54A and 54B described above and the description will not be repeated herein, although the bond pads 62A and 62B need not be the same as the bond pads 54A and 54B. The semiconductor device 200 may be mounted to the substrate 60 by placing the bumps 56A and 56B in physical connection with the bond pads 62A and 62B and then performing a reflow process to reflow the bumps 56A and 56B and to bond the semiconductor device 200 to the substrate 60.

After the semiconductor device 200 is bonded to the substrate 60, an underfill 58 may be formed between the substrate 50 and the substrate 60 surrounding the bumps 56A' and 56B'. Underfill materials provide some stress relief and may include thermally conductive filler materials, to assist in handling mechanical stress from thermal expansion. Underfill 58 may comprise resins, epoxies, polymers, no flow underfill (NUF), capillary underfill, the like, or a combination thereof and may be injected between the substrate 50 and the substrate 60.

Figure 4:
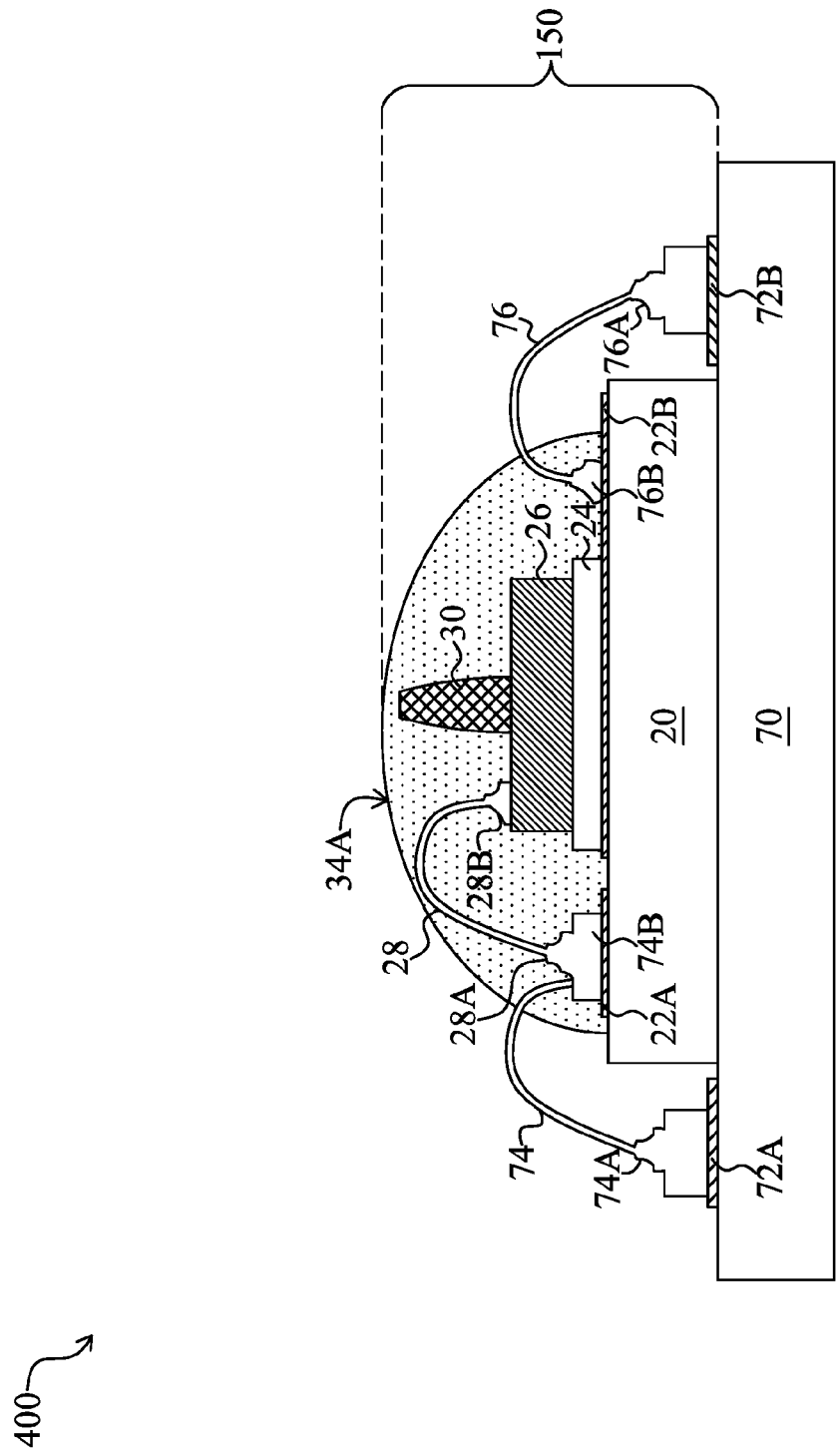
FIG. 4 illustrates a semiconductor device according to another embodiment.

FIG. 4 illustrates semiconductor device 400 according to another embodiment, wherein the semiconductor device 400 includes the semiconductor device 150 (see FIG. 1D) mounted to a substrate 70 and wire bonds 74 and 76 interconnecting the semiconductor device 150 and the substrate 70. Details regarding this embodiment that are similar to those for the previously described embodiment will not be repeated herein.

After the formation of the semiconductor device 150 (see FIG. 1D), the substrate 20 may be mounted to substrate 70. The substrate 70 may be similar to substrate 20 described above and the description will not be repeated herein, although the substrates 70 and 20 need not be the same. The substrate 20 may be mounted to substrate 70 by an adhesive layer (not shown). The adhesive layer may be disposed, for example laminated, on the substrate 70. The adhesive layer may be formed of a glue, such as an ultra-violet glue, or may be a lamination layer formed of a foil.

RDLs 72A and 72B may be formed on a top surface of substrate 70. The RDLs 72A and 72B may be similar to RDLs 22A and 22B described above and the description will not be repeated herein, although the RDLs 72A, 72B, 22A, and 22B need not be the same. Wire bond 74 may be formed to electrically couple RDL 72A and RDL 22A, and wire bond 76 may be formed to electrically couple 72B and 22B. The wire bonds 74 and 76 may be similar to wire bond 28 described above and the description will not be repeated herein, although the wire bonds 72, 76, and 28 need not be the same.

The number of wire bonds 28, 74, and 76 are only for illustrative purposes and are not limiting. There could be any suitable number of wire bonds 28, 74, and 76.

By having a vertical waveguide formed directly on an optical device, the overall cost of forming the light coupling device may be lowered. Also, the light coupling efficiency is improved because the vertical waveguide is formed directly on the optical device. Because the capping layer surrounds the vertical waveguide and acts as a ball lens, there is no alignment process necessary between the vertical waveguide and a ball lens. The TSV and wire bonding structure of the embodiments allows for wafer level packaging and can reduce the total package size.

An embodiment is a semiconductor device comprising an optical device over a first substrate, a vertical waveguide on a top surface of the optical device, the vertical waveguide having a first refractive index, and a capping layer over the vertical waveguide, the capping layer configured to be a lens for the vertical waveguide and the capping layer having a second refractive index.

Another embodiment is a semiconductor device comprising a first redistribution layer over a first side of a first substrate, an optical device bonded to the first redistribution layer, a vertical waveguide on a top surface of the optical device, and a second redistribution layer over the substrate. The semiconductor device further comprises a first wire bond coupling the second redistribution layer to the top surface of the optical device, a lens layer over the vertical waveguide, the optical device, and the first wire bond, a first through substrate via extending through the first substrate from the second redistribution layer to a back side of the first substrate, and a first connector coupled to the first through substrate via on the back side of the first substrate.

Yet another embodiment is a method of forming a semiconductor device, the method comprising bonding an optical device to a first side of a first substrate, coupling the optical device to the first substrate, forming a vertical waveguide on a top surface of the optical device, and forming a capping layer over the vertical waveguide and the optical device, the capping layer configured to be a lens for the vertical waveguide.

Although the present embodiments and their advantages have been described in detail, it should be understood that various changes, substitutions, and alterations can be made herein without departing from the spirit and scope of the disclosure as defined by the appended claims. Moreover, the scope of the present application is not intended to be limited to the particular embodiments of the process, machine, manufacture, composition of matter, means, methods, and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A device comprising:
   an optical device over a first substrate;
   a vertical waveguide on a top surface of the optical device, the vertical waveguide having a longitudinal axis that is substantially orthogonal to a top surface of the first substrate; and
   a lens layer over the vertical waveguide, the lens layer encapsulating the vertical waveguide, the optical device, and at least a portion of the top surface of the first substrate.

2. The device of claim 1, wherein the vertical waveguide comprises a polymer and the lens layer comprises a polymer.

3. The device of claim 1, wherein the vertical waveguide has a first refractive index and wherein the lens layer has second refractive index, the second refractive index being different than the first refractive index.

4. The device of claim 3, wherein the first refractive index is greater than the second refractive index.

5. The device of claim 1, wherein a top surface of the lens layer forms a dome over a top surface of the first substrate, the top surface of the lens layer being over a top surface of the vertical waveguide.

6. The device of claim 1 further comprising:
   a first redistribution layer over the first substrate;
   a first wire bond coupling the first redistribution layer and the optical device; and
   a second redistribution layer over the first substrate, the optical device being coupled to the second redistribution layer.

7. The device of claim 6, wherein the first wire bond is surrounded by the lens layer.

8. The device of claim 6 further comprising:
   the first substrate being mounted to a second substrate;
   a second wire bond coupling the second substrate to the first redistribution layer; and
   a third wire bond coupling the second substrate to the second redistribution layer.

9. A device comprising:
   a first redistribution layer over a first side of a first substrate;
   an optical device bonded to the first redistribution layer;
   a vertical waveguide on a surface of the optical device;
   a second redistribution layer over the first substrate, the second redistribution layer being coupled to the surface of the optical device; and
   a lens layer over the vertical waveguide and the optical device.

10. The device of claim 9, wherein the optical device comprises a vertical-cavity surface-emitting laser.

11. The device of claim 9, wherein the second redistribution layer is coupled to the surface of the optical device by a first wire bond.

12. The device of claim 9, wherein the lens layer encapsulates the vertical waveguide, the optical device, and the first side of the first substrate.

13. The device of claim 9 further comprising:
    a first through substrate via extending through the first substrate from the first redistribution layer to a back side of the first substrate;
    a first connector coupled to the first through substrate via on the back side of the first substrate;
    a second through substrate via extending through the first substrate from the second redistribution layer to the back side of the first substrate; and
    a second connector coupled to the second through substrate via on the back side of the first substrate;
    the first and second connectors coupling the first substrate to a second substrate; and
    an underfill material between the first and second substrates and surrounding the first and second connectors.

14. The device of claim 9, wherein the vertical waveguide comprises a polymer and the lens layer comprises a polymer.

15. A method comprising:
    attaching an optical device to a first side of a first substrate;
    coupling the optical device to the first substrate;
    dispensing a first polymer material directly on a surface of the optical device to form a vertical waveguide on the surface of the optical device; and
    dispensing a second polymer material over the vertical waveguide, the optical device, and the first side of the first substrate to form a lens layer.

16. The method of claim 15, wherein the first polymer material has a first refractive index and the second polymer material has a second refractive index, the second refractive index being less than the first refractive index.

17. The method of claim 15, wherein the lens layer directly adjoins the vertical waveguide and the optical device.

18. The method of claim 15, wherein the coupling the optical device further comprises:
- forming a first redistribution layer over the first side of the first substrate;
- bonding the optical device to the first redistribution layer;
- forming a second redistribution layer over the first side of the first substrate; and
- forming a first wire bond from the second redistribution layer to the optical device.

19. The method of claim 18 further comprising:
- forming a first through substrate via extending from the first side of the first substrate to a second side of the first substrate, the first through substrate via being coupled to the first redistribution layer;
- coupling a first connector to the first through substrate via on the second side of the first substrate;
- forming a second through substrate via extending from the first side of the first substrate to a second side of the first substrate, the second through substrate via being coupled to the second redistribution layer; and
- coupling a second connector to the second through substrate via on the second side of the first substrate;
- mounting the first substrate to a second substrate using the first and second connectors; and
- forming an underfill material between the first and second substrates and surrounding the first and second connectors.

20. The device of claim 1, wherein the optical device comprises a vertical-cavity surface-emitting laser.

* * * * *